United States Patent [19]
Wieloch et al.

[11] Patent Number: 5,648,892
[45] Date of Patent: Jul. 15, 1997

[54] WIRELESS CIRCUIT BOARD SYSTEM FOR A MOTOR CONTROLLER

[75] Inventors: Christopher J. Wieloch, Brookfield; Thomas E. Babinski, Kenosha, both of Wis.; John C. Mather, Cedar Rapids, Iowa; Gerard A. Woychik, Waukesha; Steven R. McLaughlin, Muskego, both of Wis.

[73] Assignee: Allen-Bradley Company, Inc., Milwaukee, Wis.

[21] Appl. No.: 536,224

[22] Filed: Sep. 29, 1995

[51] Int. Cl.$^6$ ...................................................... H05K 7/20
[52] U.S. Cl. ........................... 361/788; 361/707; 361/775; 439/65
[58] Field of Search ................................ 257/713, 720, 257/723, 724; 174/16.3, 252, 250, 260, 262; 439/59, 62, 65, 67, 485, 487; 361/704, 707, 712, 721, 717–719, 748, 749, 760, 761, 763, 764, 775, 784, 785, 788, 789, 792; 363/141

[56] References Cited

U.S. PATENT DOCUMENTS

| | | |
|---|---|---|
| 3,760,090 | 9/1973 | Fowler . |
| 4,023,078 | 5/1977 | Olliges ........................................ 361/399 |
| 4,272,141 | 6/1981 | McKeen ..................................... 339/18 R |
| 4,630,172 | 12/1986 | Stenerson et al. . |
| 4,693,530 | 9/1987 | Stillie ............................................ 439/67 |
| 4,861,272 | 8/1989 | Clark . |
| 4,998,180 | 3/1991 | McAuliffe ................................. 361/383 |
| 5,041,899 | 8/1991 | Oku et al. . |
| 5,045,642 | 9/1991 | Ohta et al. . |
| 5,059,557 | 10/1991 | Cragon et al. . |
| 5,306,874 | 4/1994 | Biron . |
| 5,315,482 | 5/1994 | Tanaka ...................................... 361/707 |
| 5,455,742 | 10/1995 | Phoy ......................................... 361/778 |
| 5,484,965 | 1/1996 | Woychik .................................... 174/262 |

FOREIGN PATENT DOCUMENTS

| | | |
|---|---|---|
| 2442-570 | 7/1980 | France . |
| 50-78204 | 6/1975 | Japan . |
| 1-248590 | 10/1989 | Japan . |

*Primary Examiner*—Gerald P. Tolin
*Attorney, Agent, or Firm*—Joseph N. Ziebert; John M. Miller; John J. Horn

[57] ABSTRACT

A multilayer circuit board system or laminated circuit board system for use in a motor controller includes a motherboard, at least one power substrate circuit board, and a capacitor circuit board. The power substrate module includes a mounting area provided in a recess, window or portion of the circuit board where the circuit board is only a single layer thick. The single circuit board layer at the mounting area provides a heat conductive yet highly electrically insulated mounting area for receiving a heat sink. The heat sink can be mounted on a side opposite the electrical device. The capacitor circuit board, power substrate circuit board, and mother circuit board are interconnected without the use of external connectors or wires. A flexible circuit board layer or SCM™ interconnect interface allows the circuit boards to be connected solely by printed circuit (PC) wires.

17 Claims, 14 Drawing Sheets

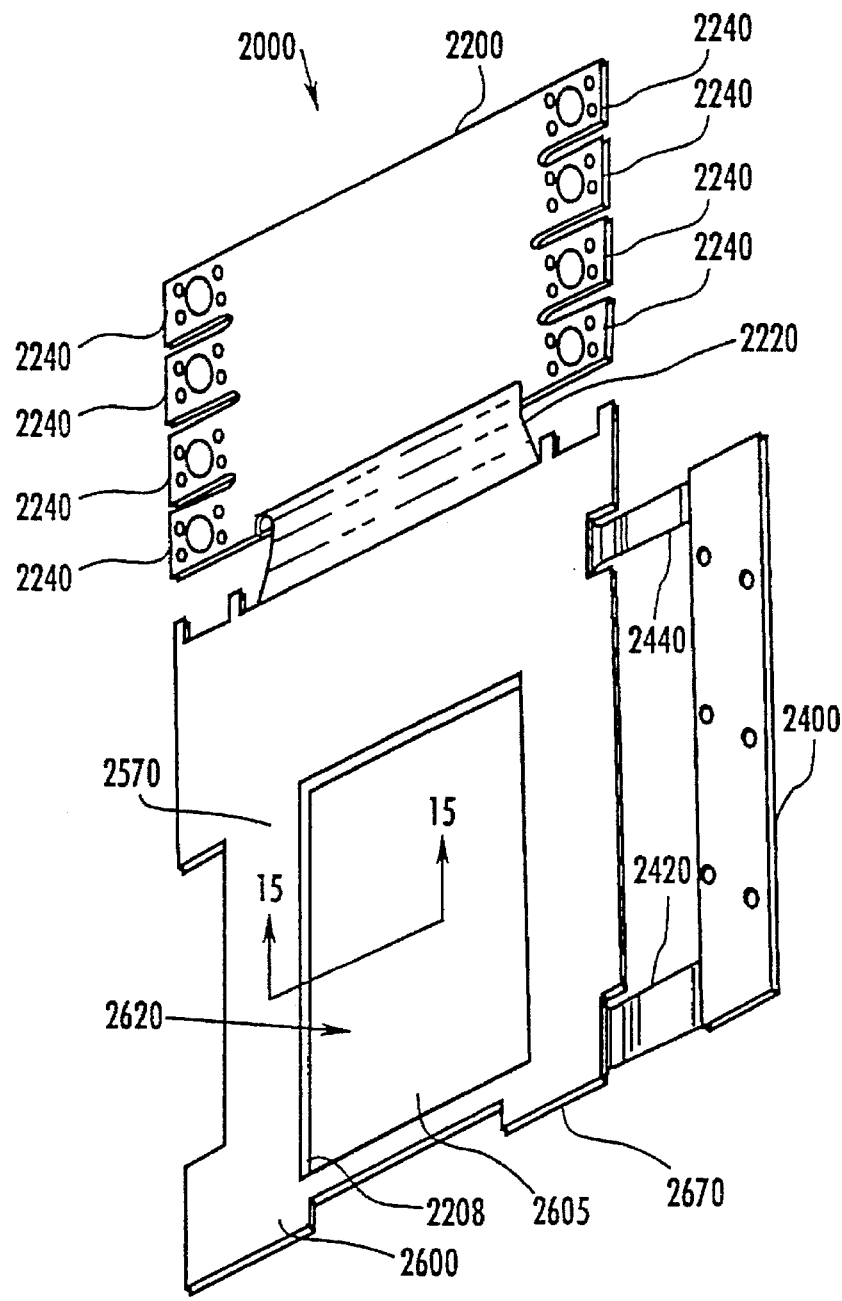
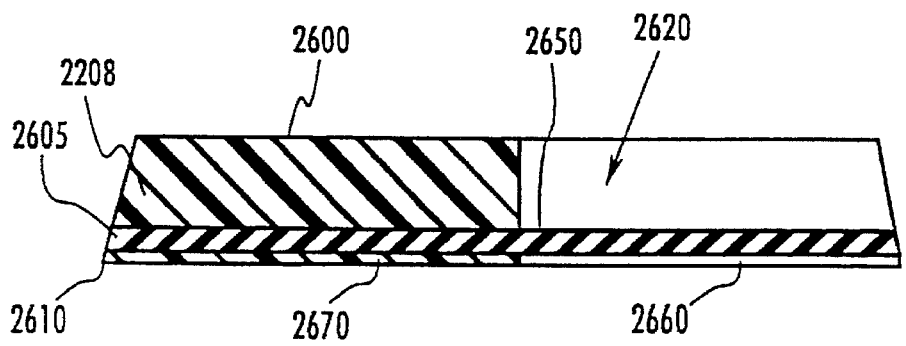
FIG. 14
FIG. 15

WIRELESS CIRCUIT BOARD SYSTEM FOR A MOTOR CONTROLLER

CROSS-REFERENCE TO RELATED APPLICATIONS

The present application is related to U.S. patent application Ser. No. 08/316,667, filed Sep. 30, 1994 by Woychik, now U.S. Pat. No. 5,484,965, U.S. patent application Ser. No. 08/292,491, filed Aug. 18, 1994 by Wieloch which is the parent of U.S. Ser. No. 08/522,906, filed Nov. 3, 1995 by Wieloch, U.S. patent application Ser. No. 08/527,120 entitled, "Circuit Board Having A Window Adapted To Receive A Single In-Line Package Module," filed Sep. 12, 1995 by Woychik, U.S. patent application Ser. No. 08/527,315 entitled, "A Module Interconnect Adapted For Reduced Parasitic Inductance," filed Sep. 12, 1995, by Woychik, U.S. patent application Ser. No. 08/537,216 entitled, "Rigid-Flex Circuit Board Having a Window for an Insulated Mounting Area," filed by McLaughlin et al on an even date herewith, U.S. patent application Ser. No. 08/536,839 entitled "A Multilayer Circuit Board Having A Window Exposing An Enhanced Conductive Layer For Use As An Insulated Mounting Area," filed by Wieloch et al on an even date herewith, U.S. patent application Ser. No. 08/537,722 entitled, "A Method Of Making A Multilayer Circuit Board Having A Window Exposing An Enhanced Conductive Layer For Use As An Insulated Mounting Layer", filed by Wieloch et al on an even date herewith, and U.S. patent application Ser. No. 08/536,736 entitled, "Power Substrate With Improved Thermal Characteristics", filed by Wieloch et al on an even date herewith and U.S. patent application Ser. No. 08/536,877, entitled, "Power Structure", filed by Wieloch et al. on an even date herewith.

FIELD OF THE INVENTION

The present invention relates to a circuit board system for power applications. More particularly, the present invention relates to a wireless motor controller package configured to reduce parasitic inductance associate with circuit board interconnections.

BACKGROUND OF THE INVENTION

In general, high power applications such as motor controllers, inverters, converters, power supplies, or other control devices often utilize a number of circuit boards. Typically, these boards include power modules which house high-power electrical devices such as resistors and semiconductors, logic or customer interface circuit boards (e.g., motherboard) which house microprocessors or other logic devices for performing control functions, and storage or capacitor circuit boards which house charge storage devices and direct current (DC) power busses. For example, in the field of electronic motor controllers, it is commonplace to build a controller package as an assemblage of circuit boards including a power substrate module or other heat dissipating medium. Each of the circuit boards supports components and conducting paths for accomplishing various functions in the completed device.

Such motor controllers generally include control logic circuitry, charge storage circuitry and power components. The control logic circuitry, typically including programmable solid state circuits such as a programmable logic controller mounted on a motherboard or a separate logic circuit module, monitors operating parameters of the motor and generates control signals for driving the motor in accordance with a preset control routine and various operator inputs. The power components typically include diode rectifying circuits for receiving AC power from a source and converting it to DC power, and power transistors or similar solid state switching devices, such as insulated gate bi-polar transistors (IGBTs), for converting the DC power stored in the charge storage circuitry to controlled AC signals for driving the motor based upon the control signals produced by the control circuitry.

The power components are mounted on a power substrate module circuit board. The logic circuitry is typically mounted on a customer interface or mother circuit board, and the charge storage circuitry is mounted on a capacitor board.

These circuit board systems typically require module or circuit board interconnection systems (e.g., connectors, header assemblies, or other hardware) to interface each circuit board (e.g., the power substrate module, the customer interface board, the motherboard and capacitor board). Module interconnection systems often include pins bent at a 90° angle. First ends of the pins insert into holes in the circuit boards or modules, and the second ends of the pins are inserted into holes in the motherboard. An insulating frame is provided between the first and second ends. The frame which is located proximate the 90° bend in the pins is usually rectangularly shaped and provides a stable seat or structure between the motherboard and the module. The first and second ends of the pins are soldered to contact areas proximate the holes on the modules and the motherboard, respectively. Alternatively, module interconnection systems may include slot edge connectors, card connectors, or other printed circuit board (PCB) connectors, or the circuit boards may be interconnected with external wires, cables or connectors.

Such interconnection systems are not only expensive, bulky, and add to the cost of assembling the circuit board system, but create significant impedance matching problems in high power applications such as in motor controller applications. For example, motor controllers and high power circuits such as inverters, converters, and power supplies often must include snubbing circuits, or other resistive (R), capacitive (C), or inductive (L) networks to tune the circuit boards and reduce the parasitic inductive effects and capacitive effects associated with the circuit board interconnection systems. These parasitic inductance problems between circuit boards are amplified by the very high switching frequency and the power associated with power modules, particularly in the turnoff phase of inverter operation.

Additionally, circuit board systems utilized in power applications often generate a significant amount of heat, and require heat sinks or other thermal management systems to prevent the circuit boards and electrical devices from overheating. Heat sinks are typically metal components relatively large in size and can be secured to circuit boards or associated electrical devices to enhance heat dissipation therefrom. Conventional heat sinks typically add to the cost of assembly of the circuit board system. Therefore, applications such as motor control applications require circuit board systems which are optimized for superior heat dissipation.

Thus, there is a need for a circuit board system for a motor controller optimized to reduce parasitic inductance. There is also a need for a low cost motor controller circuit board system optimized for heat dissipation and ease of assembly.

SUMMARY OF THE INVENTION

The present invention relates to a wireless motor controller including a power substrate circuit board, a capacitive circuit board, and a first circuit board. The power substrate circuit board includes semiconductor switches, and the capacitive circuit board includes a plurality of storage capacitors coupled between a positive bus and a negative bus. The first circuit board is mechanically and electrically coupled to at least one of the power substrate circuit board and the capacitor circuit board. The positive bus and negative bus on the capacitor circuit board are electrically coupled to the power substrate circuit board solely via printed wire circuit board conductors.

The present invention also relates to a motor controller circuit board system including a power substrate mounting board including semi-conductor switches, a capacitor mounting board including a plurality of storage capacitors coupled between a fist bus and a second bus, and a mounted circuit board including a plurality of mounting areas integral with the mounted circuit board. The mounting area mechanically and electrically receive the power substrate mounting board and the capacitor mounting board. The positive bus on the capacitor mounting board is electrically coupled to the power substrate mounting board via a plurality of printed wire circuit board conductors on the mounted circuit board.

The present invention relates to improved motor controller circuit board system including a power substrate circuit board, a capacitor circuit board, and a first circuit board. The power substrate circuit board and the capacitor circuit board each are mounted to the mother circuit board at an angle greater than 0° and less than 180°. The improvement includes an electrical connection of the power substrate circuit board and the capacitor circuit board solely via printed circuit board conductors.

According to one aspect of the present invention, the circuit board system is used in a motor controller package and includes solderable component module SCM™ interconnects, or board modules, and a mother circuit board. The board modules are mechanically and electrically coupled to the motherboard at a 90° angle. The small foot print associated with the interconnection of the modules and the mother circuit board allows the motor controller to be packaged in a minimal amount of space and reduces the parasitic inductance associated with the interconnection.

In another exemplary aspect of the present invention, the circuit board system allows the heat sinks to be soldered directly to the bottom surface of the power substrate module. The power substrate module is preferably optimized for heat dissipation, thereby providing superior heat transmission at a very low cost using only a minimal amount of board space.

According to an even further exemplary embodiment of the present invention, the motor controller does not utilize external wires or conventional connectors to couple the circuit board modules together. The present invention advantageously utilizes printed wire circuit board conductors and finger connectors to mechanically and electrically couple the circuit board modules to the motherboard. A motherboard may be configured to have slots or apertures for receiving edges of the circuit board modules. The edges of the circuit board modules preferably include finger connectors which can be soldered to mounting features on the motherboard. Alternatively, a continuous flexible circuit board layer integral with the mother circuit board or power module circuit board and the other circuit boards may be utilized to provide interconnection between the circuit board modules, thereby eliminating expensive connector hardware.

BRIEF DESCRIPTION OF THE DRAWINGS

The preferred embodiments of the invention will hereinafter be described in conjunction with the appended drawings, wherein like numerals denote like elements, and:

FIG. 14 is a perspective view of the rigid-flex multilayer circuit board illustrated in FIG. 13 in a flat configuration; and FIG. 15 is a cross sectional view of the rigid-flex circuit board system illustrated in FIG. 14 along line 15—15.

Figure 1:
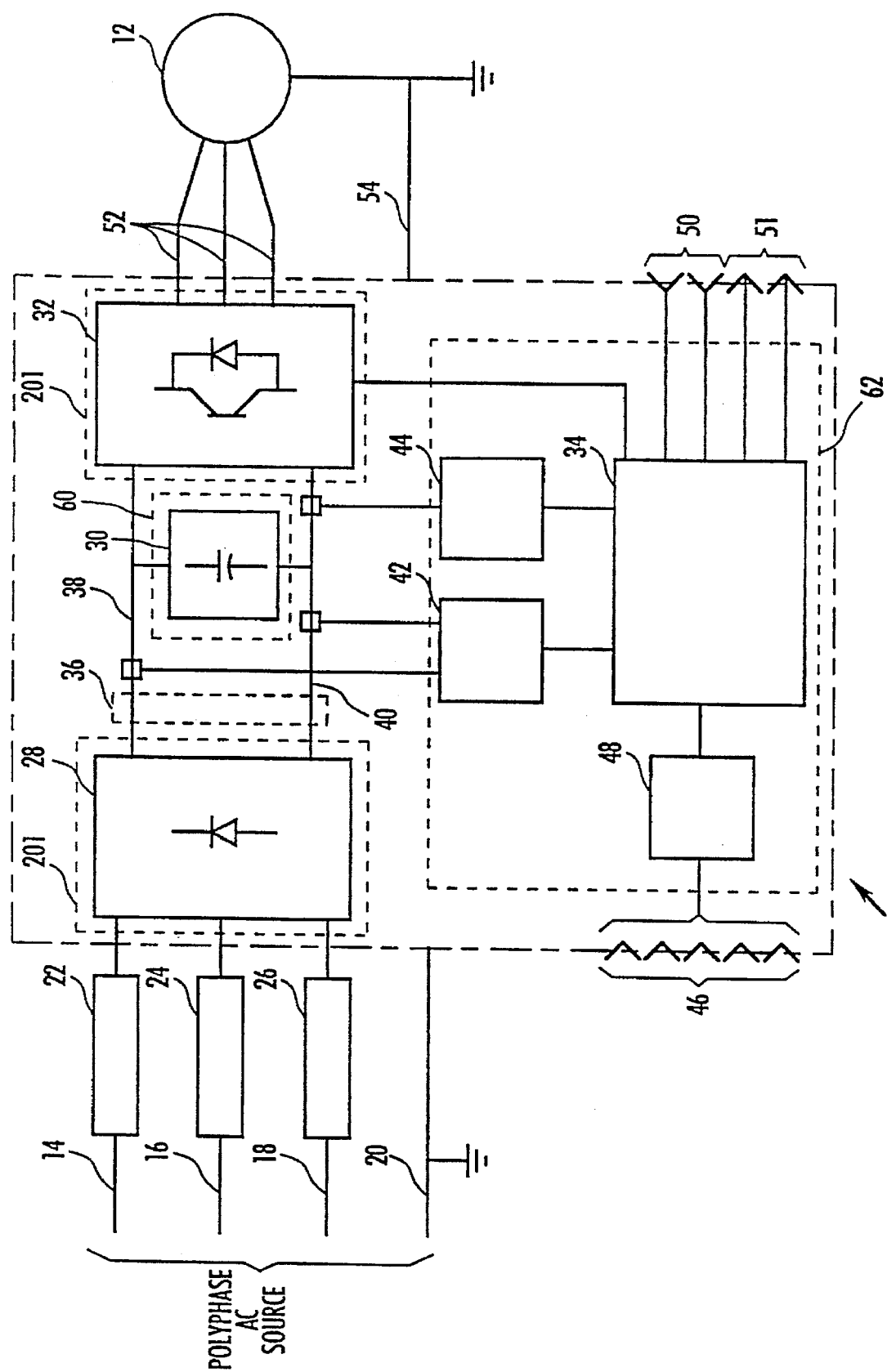
FIG. 1 is an electrical schematic block diagram of circuitry associated with a motor controller in accordance with a first exemplary embodiment of the present invention.

DETAILED DESCRIPTION OF THE PREFERRED EXEMPLARY EMBODIMENTS OF THE PRESENT INVENTION

Although the following description refers to a specific application of the present drive to control a three-phase motor, the invention may be more generally applicable to both polyphase and single phase motors of various power ratings and sizes. Turning now to the drawings and referring first to FIG. 1, a motor controller or motor drive control system 10 is illustrated diagrammatically as it would be installed for driving an electric motor 12 at desired speeds. Thus installed, system 10 is coupled to phase conductors 14, 16, 18 and a ground conductor 20 via protective circuits, typically including fuses 22, 24, 26.

Control system 10 includes a number of interconnected circuits, preferably configured within a unitary drive package. As illustrated in FIG. 1, system 10 includes a rectifying circuit 28, a capacitive circuit 30, a signal converting circuit 32 and a control circuit 34. Rectifying circuit 28, capacitive circuit 30 and signal converting circuit 32 may be of types generally known in the art, such as the circuits incorporated in the Bulletin 1305 motor drives available from the Allen-Bradley Company of Milwaukee, Wis. Rectifying circuit 28 and signal converting circuit 32 are combined as power circuitry 200 and discussed in greater detail below with reference to FIG. 5.

In the present embodiment of system 10, control circuit 34 can be a microprocessor (digital processor) based circuit that includes an analog-to-digital converter (not shown) as a circuit which is integral to the microprocessor. Control circuit 34 can also include memory circuits (not shown), such as RAM and ROM (e.g. EPROM), that may be internal or external to the microprocessor. Programming that controls the microprocessor is stored in ROM, while the microprocessor utilizes RAM to temporarily store variable data which is utilized during the execution of the programs stored in ROM. The analog-to-digital converter converts analog signals (e.g. parameter signals) received by control circuit 34, as discussed below, to digital data representative of these signals. Accordingly, the analog-to-digital converter produces real-time digital data at a predetermined sampling interval which is representative of parameter signals communicated to control circuit 34.

Rectifying circuit 28 is coupled to incoming phase conductors 14, 16, 18 and includes circuitry for converting alternating current power from the incoming phase conductors to direct current power. Rectifying circuit 28 thus acts as a direct current source within system 10, supplying DC power to signal converting circuit 32 via a DC bus 36 including signal converting circuit input lines 38 and 40. Signal converting circuit 32 receives DC power from bus 36 and includes circuitry, preferably including solid state switching elements (not shown in FIG. 1), for generating pulsed power signals at desired, variable frequencies for driving motor 12.

A bus voltage monitoring circuit 42 is coupled across lines 38 and 40 of DC bus 36 and includes circuitry for measuring the DC voltage difference between lines 38 and 40 and for producing a signal, representative of the DC bus voltage. Voltage monitoring circuit 42 is, in turn, coupled to control circuit 34 and provides the DC bus voltage signal to control circuit 34 for control of motor 12 as described below. A bus voltage current monitoring circuit 44 is also coupled to DC bus 36 and includes circuitry for measuring the current flowing through DC bus 36 and producing a signal representative thereof, which is in turn applied to control circuit 34.

In addition to inputs from voltage and current monitoring circuits 42 and 44, control circuit 34 is typically coupled to a number of input channels, designated generally by the reference numeral 46. Channels 46 may receive incoming signals from such external elements as start and stop circuits, reverse and jog switches and the like, typically arranged in a control terminal block (not shown). Such inputs are communicated to control circuit 34, preferably through an opto-isolating circuit 48 for protecting control circuit 34 from power surges. Moreover, control circuit 34 receives input signals through one or more ports 50. One such port 50 is generally coupled to a command input device, such as a potentiometer (not shown), for generating and supplying control circuit 34 with a target or desired output speed or frequency level. Other ports 50 may be provided for various programming and control interface devices, such as a hand-held human interface module (not shown) or a digital computer data link. One or more output or monitoring ports 51 are preferably linked to control circuit 34, along with appropriate analog circuitry, for selectively monitoring the various operating parameters of system 10, such as the desired and actual frequency or speed outputs.

Control circuit 34 is coupled to signal converting circuit 32 both for receiving signals from circuit 32 and for communicating control signals, to circuit 32 to drive motor 12. In response to the control signals, signal converting circuit 32 generates pulsed drive signals that are applied to motor 12 via output lines or conductors 52. Motor 12 is also coupled to system 10 via a ground conductor 54. Signal converting circuit 32 includes circuitry (not shown) for monitoring the output current of the drive signals applied to motor 12 through each phase conductor 52 and for generating current signals. These current signals are communicated to control circuit 34 as feedback for control of motor 12. In addition to the output current signals, signal converting circuit 32 may include circuitry (not shown) for detecting and monitoring other operating parameters of motor 12 or system 10, such as temperature.

Figure 5:
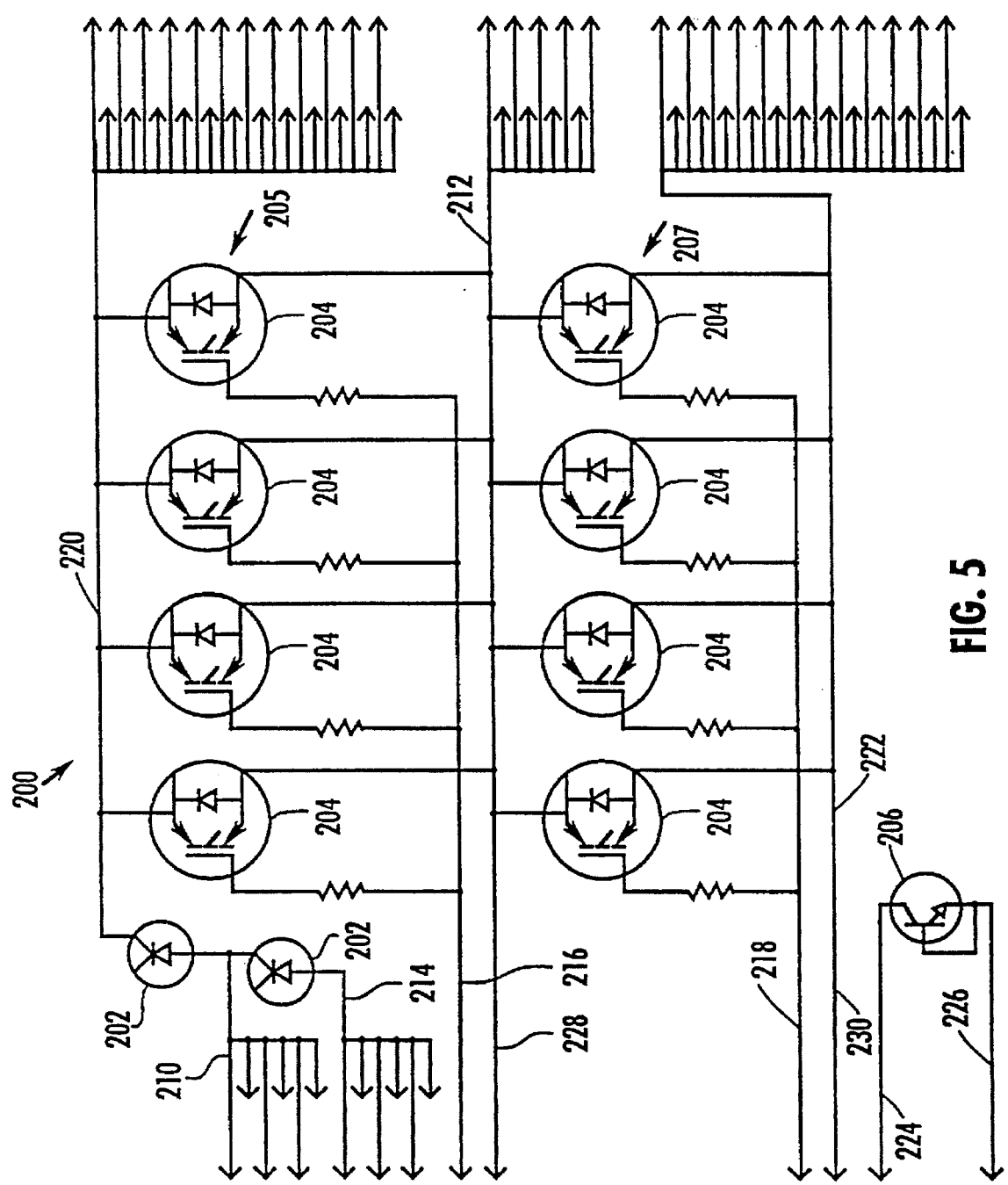
FIG. 5 is a more detailed schematic electrical diagram of the components and interconnections of the power module circuit board illustrated in FIG. 1.

Control circuit 34, voltage monitoring circuitry 42, current monitor circuit 44, control circuit 34, and opto-isolating circuit are preferably mounted on an interface or mother circuit board 62. Rectifying circuit 28 and signal converting circuit 32 are mounted on at least one power substrate circuit board 201 as power circuitry 200 (FIG. 5). Capacitive circuit 30 is mounted on a capacitor circuit board 60. Preferably, rectifying circuit 28 and signal converting circuit 32 may be divided into three separate circuits for each phase of input power and of motor 12. Each of the three circuits 28 and 32 may be mounted on a separate power substrate circuit board 201. Alternatively, capacitive circuit 30, rectifying circuit 28, and signal converting circuit 32 may be mounted on a single circuit board.

Figure 2:
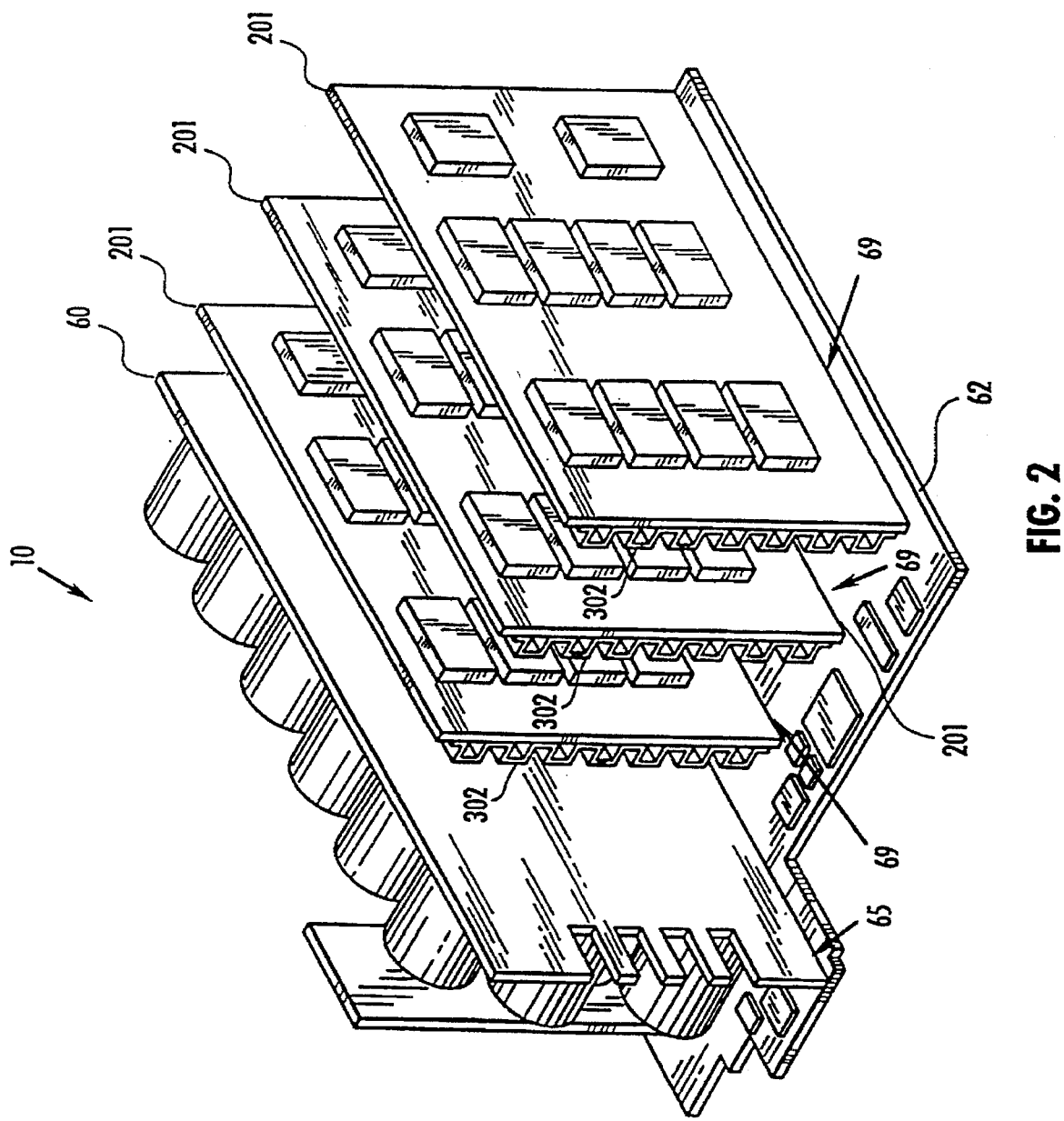
FIG. 2 is a perspective view of a circuit board system including the circuitry illustrated in FIG. 1 in accordance with the first exemplary embodiment of the present invention.

With reference to FIG. 2, mother circuit board 62 is a multi-layer circuit board which houses three power module circuit boards 201 and capacitor circuit board 60 in a perpendicular fashion. Capacitor circuit board 60 is mounted in a mounting feature, area or region 65, and circuit boards 201 are mounted in mounting features, areas or regions 69. Preferably, heat sinks 302 are disposed on circuit boards 201 in a parallel fashion with other circuit boards 201. The orientation of circuit boards 201 and 60 provides optimum heat transfer from system 10. A fan (not shown) may be employed to blow air in parallel with boards 201 and heat sinks 302.

Figure 3:
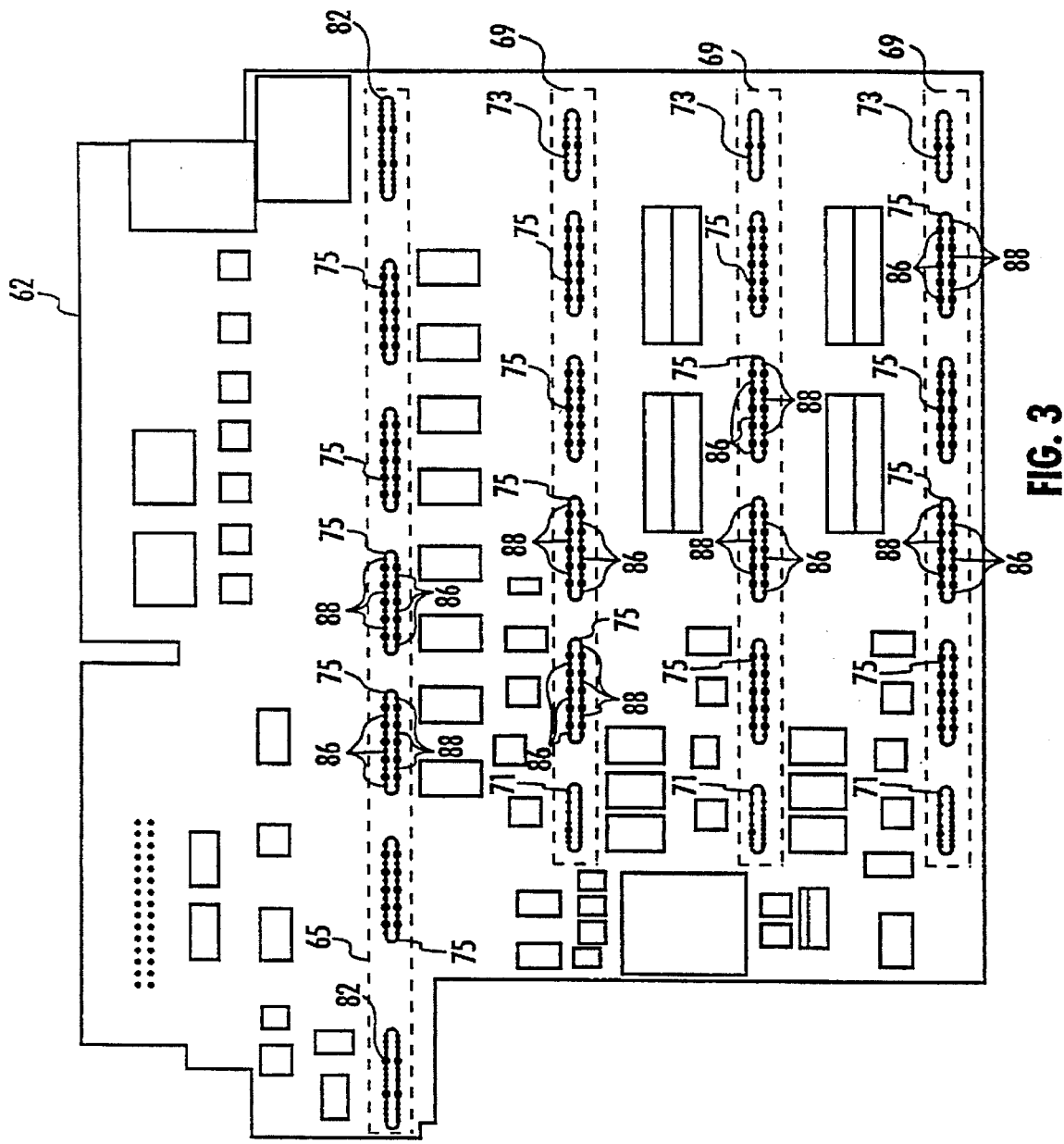
FIG. 3 is a top view of the motherboard illustrated in FIG. 2.

In FIG. 3, mounting region 65 includes trenches, slots or apertures 82 for receiving control, power and logic signals and trenches, slots or apertures 75 dedicated to receive power signals from board 60. Each aperture 75 includes plated regions or finger connectors 86 and 88. Finger connectors 86 are dedicated to receive a negative bus from board 60 (e.g., bus 222 in FIGS. 5–12). Finger connectors 88 are dedicated to receive the positive bus from capacitor circuit board 60 (e.g., bus 220 in FIGS. 5–12).

Motherboard 62 also includes mounting features, areas, or regions 69 for receiving circuit boards 201. Each mounting region 69 includes four slots, trenches, or apertures 75 having finger connectors 86 and 88 dedicated to receive positive and negative buses from capacitor board 60. Additionally, mounting region 69 includes an aperture 71 dedicated to receive and provide motor output signals such as on bus 52 (FIG. 1 or busses 216 and 218 in FIGS. 5 and 9) and control signals for power circuitry 200. Mounting regions 69 also each include an aperture 73 having finger connectors dedicated to receive phase power inputs such as those provided on inputs 14, 16 and 18 (FIGS. 1 or phase inputs 210 and 214 in FIG. 5) as well as logic or control signals.

Figure 4:
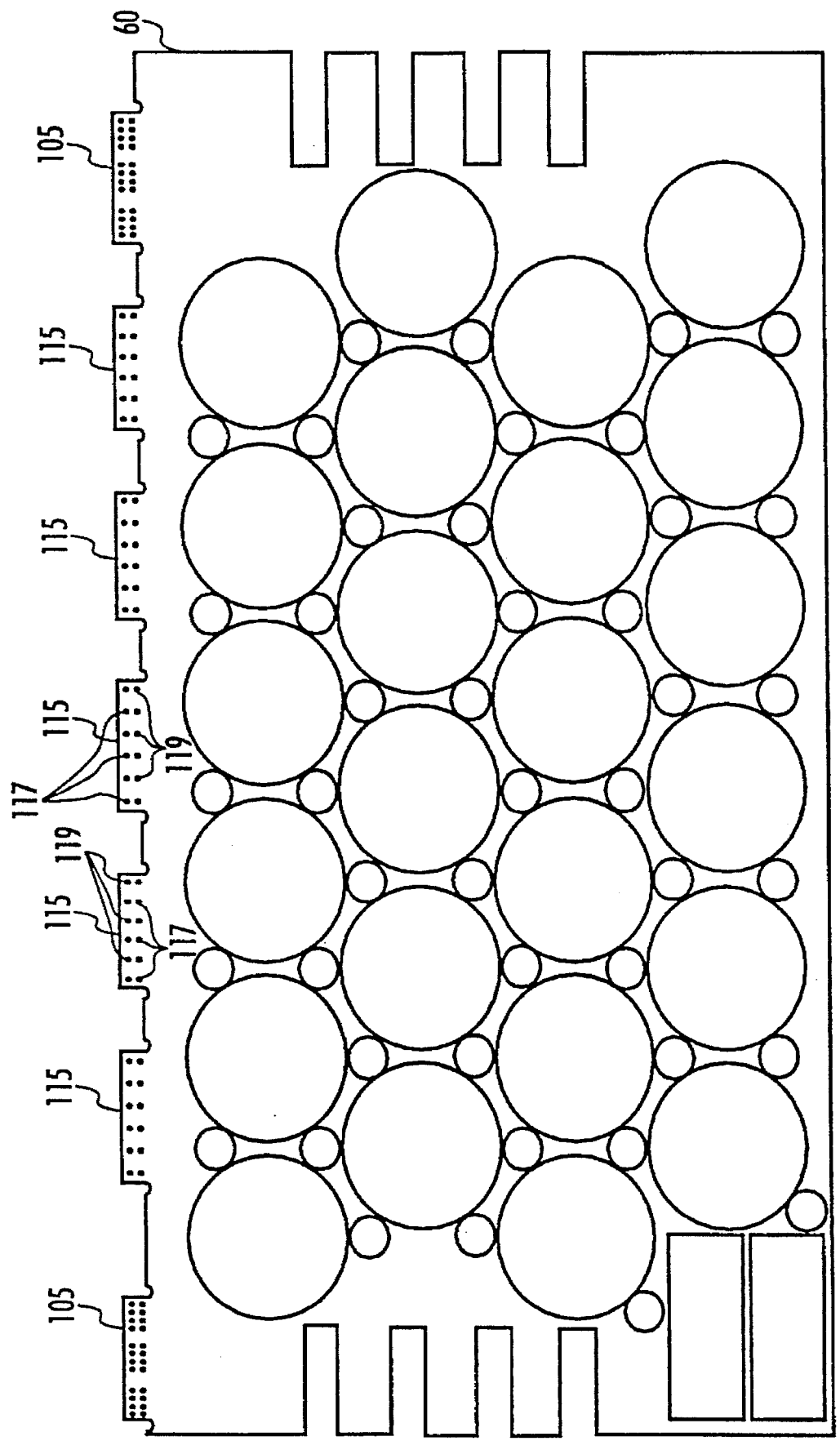
FIG. 4 is a top view of the capacitor circuit board illustrated in FIG. 2.
Figure 6:
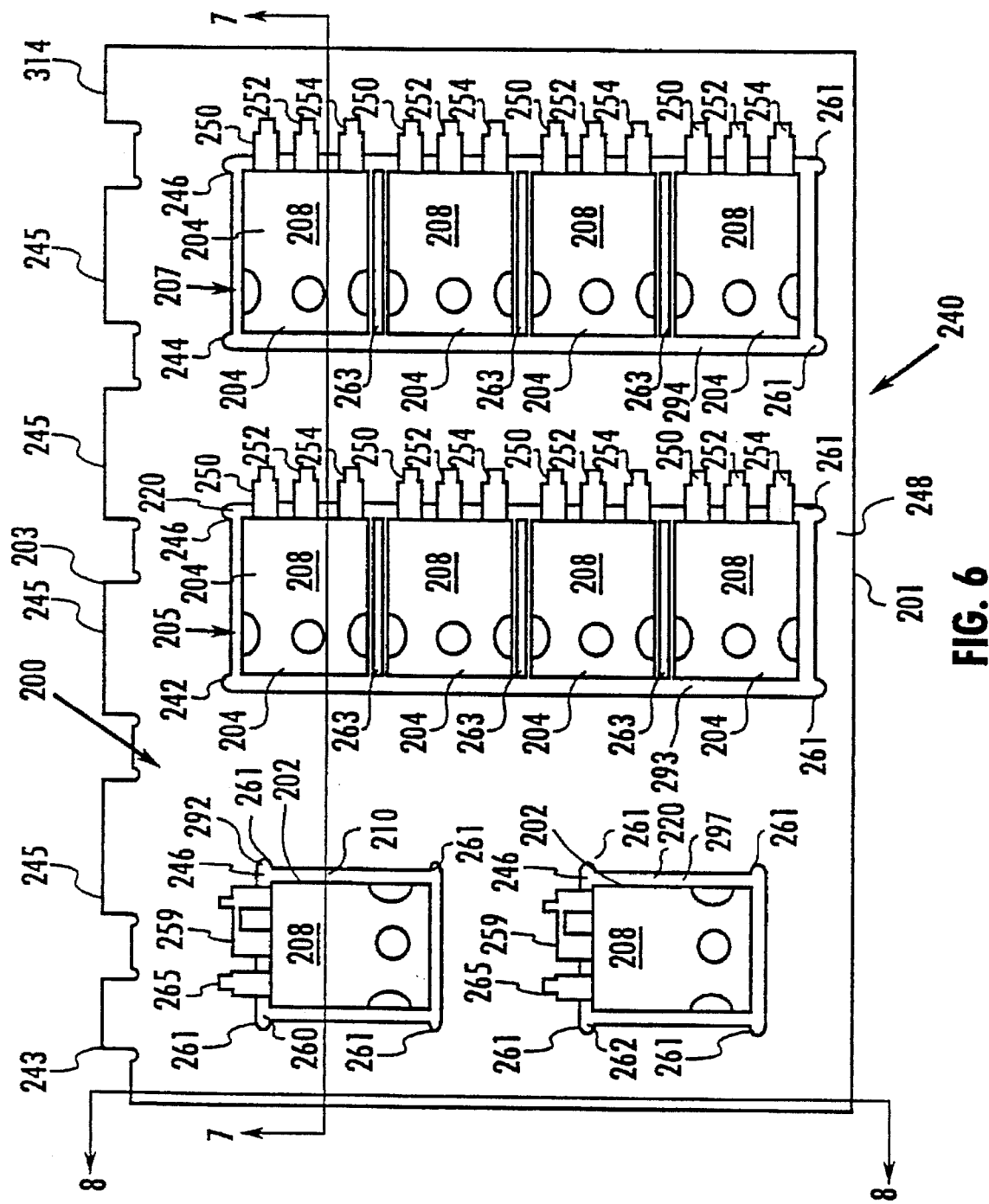
FIG. 6 is a top view of the power module circuit board shown in FIG. 2 including the components illustrated in FIG. 5 (without printed circuit board connectors)

With reference to FIG. 4, capacitor circuit board 60 includes two mounting legs 105 and five mounting legs 115. Mounting legs 115 preferably include finger connectors 117 and 119 for coupling with finger connectors 86 and 88, respectively, associated with aperture 75. Similarly, mounting legs 105 include finger connectors (not shown) for interfacing with the finger connectors associated with apertures 82. With reference to FIGS. 3 and 6, aperture 71 is configured to receive mounting leg 314 of circuit board 201, and aperture 73 is configured to receive mounting leg 243 of board 201. Mounting legs 245 include finger connectors 299 and 229 (FIG. 12) for interfacing with finger connectors 86 and 88, respectively, of apertures 75. Mounting legs 243, 245 and 314 are discussed in greater detail with reference to FIGS. 6–12.

The configuration of boards 60 and 201 including mounting legs 105, 115, 243, 245, and 314 provide a stable mechanical and electrical interconnection between boards 60, 62, and 201. Such a configuration and interconnection scheme (e.g., the SCM™ interconnection scheme) allows system 10 to be packaged in a very small package and yet have minimal parasitic inductance associated with the interconnection of boards 60, 62 and 201. Additionally, system 10 is shown as a wireless motor controller having no external wire connections between boards 60, 62 and 201.

With reference to FIG. 5, power circuitry 200 and board 201 are described in great detail below, power circuitry 200 performs the function of converting an alternating current (AC) power signal to a direct current (DC) power signal and then inverting the DC power signal to an AC output signal, such as by a pulse-width-modulation technique for driving electric motor 12. Power circuitry 200 includes rectifiers 202, semiconductor switches 204, and a temperature sensor 206. Rectifiers 202 are preferably 40EPS12 power rectifiers, and semiconductor switches 204 are preferably IRGPH50MD2 insulated gate bi-polar transistors (IGBT's). Rectifiers 202 and semiconductor switches 204 are preferably packaged in surface mount packages 208 (FIG. 6) such as a D packs, D2 packs, D3 packs, ice packs, or other high density board mounting packages. Rectifiers 202 and switches 204 may be replaced by other power semiconductor devices such as a voltage regulator, diode bridge, operational amplifier, thyristor, SCR, or triac.

Power circuitry 200 receives the single phase alternating current (AC) power signal at a phase input bus 210 and provides the AC motor output signal to a motor (not shown) at a motor output bus 212. Power circuitry 200 also includes a phase return bus 214 associated with the AC power signal at bus 210, a first gate control bus 216, a second gate control bus 218, a positive DC power bus 220, a negative DC power bus 222, a temperature signal bus 224, and a ground bus 226. Additionally, power circuitry 200 includes a first gate return bus 228 and a second gate return bus 230. Busses 210, 212, 214, 220, and 222 preferably include numerous connector lines, finger connectors, pins, or other connection interface for conducting signals to and from power circuitry 200 (discussed in more detail with reference to FIGS. 9 and 12). A bank 205 of switches 204 is coupled between power bus 220 and motor output bus 212, and a bank 207 of switches 204 is coupled between motor output bus 212 and power bus 222.

As shown in FIG. 6, power circuitry 200 is mounted on a multilayer circuit board 201 to form a power substrate module 240. Bank 205 of switches 204 is mounted in a window or recess 242 in a multilayer circuit board 201, and bank 207 of switches 204 is mounted in a recess 244 in multilayer circuit board 201. Multilayer circuit board 201 also includes recesses 260 and 262 for holding rectifiers 202. Multilayer circuit board 201 is comprised of a mounting layer 246 (e.g., at the bottom of recesses 242, 244, 260 and 262) and at least one additional circuit board layer 248.

Rectifiers 202 and switches 204 are preferably power semiconductor devices, resistors, diodes, or other components requiring relatively high heat dissipation. Rectifiers 202 and switches 204 are preferably mounted in a plastic or ceramic package 208 or other casing and include a lead frame 209 (FIG. 7) which is electrically connected to the drain of switches 204 or electrically coupled to the cathode of rectifiers 202. Leads 254 are connected to the gate of switches 204; leads 252 are coupled to the drain of switches 204; and leads 250 are coupled to the source of switches 204. Lead frame 209 is electrically and mechanically coupled to leads 252 of switches 204 and mounting layer 246. Rectifiers 202 include an anode lead 259 and a cathode lead 265. Rectifiers 202 are packaged similar to semiconductor switches 204 and include lead frame 209 (FIG. 7) electrically and mechanically coupled to mounting layer 246 and cathode lead 265.

Module 240 includes footprints or mounting areas (not shown in FIG. 6) in a pattern configured to receive leads 250, 254, and 265 and lead frames 209 of rectifiers 202 and switches 204. The footprint typically includes main pads or contact areas on mounting layer 246 corresponding to lead frames 209 and pads on circuit board layer 248 corresponding to leads 250 and 254. Because the necessary connections with lead frames 209 are completed through layer 248, lead 252 can be removed from switches 204 and lead 259 can be removed from rectifiers 202.

In the embodiment shown in FIG. 6, recesses 242, 244, 260 and 262 are rectangular and shaped in accordance with the shape of rectifiers 202 and switches 204. Recesses 242, 244, 260 and 262 each include four semi-circular corners 261 having a radius of 0.047 inches. Semi-circular corners 261 ease the manufacture of recesses 242, 244, 260 and 262.

Recesses 242 and 244 also each include three placement members 263. Members 263 are made from layer 248. Members 263 are preferably 0.068 inches wide and 0.646 inches long. Recesses 242 and 244 are each 0.834 inches wide and 2.756 inches long. Recesses 242 and 244 are configured to hold four of switches 204 in the spaces between placement members 263. Recesses 260 and 262 are each 0.638 inches wide and 0.840 inches long. The dimensions and shapes of recesses 242, 244, 260 and 262 advantageously allow rectifiers 202 and switches 204 to be securely held in multilayer circuit board 201 for ease of manufacture (e.g., soldering to board 201) and yet be easily inserted and removed. Recesses 242, 244, 260 and 262 are preferably at least one circuit board layer deep (e.g., the depth of layer 248 or approximately 0.013 inches). Alternatively, recesses 242, 244, 260 and 262 can be several layers deep.

Figure 7:
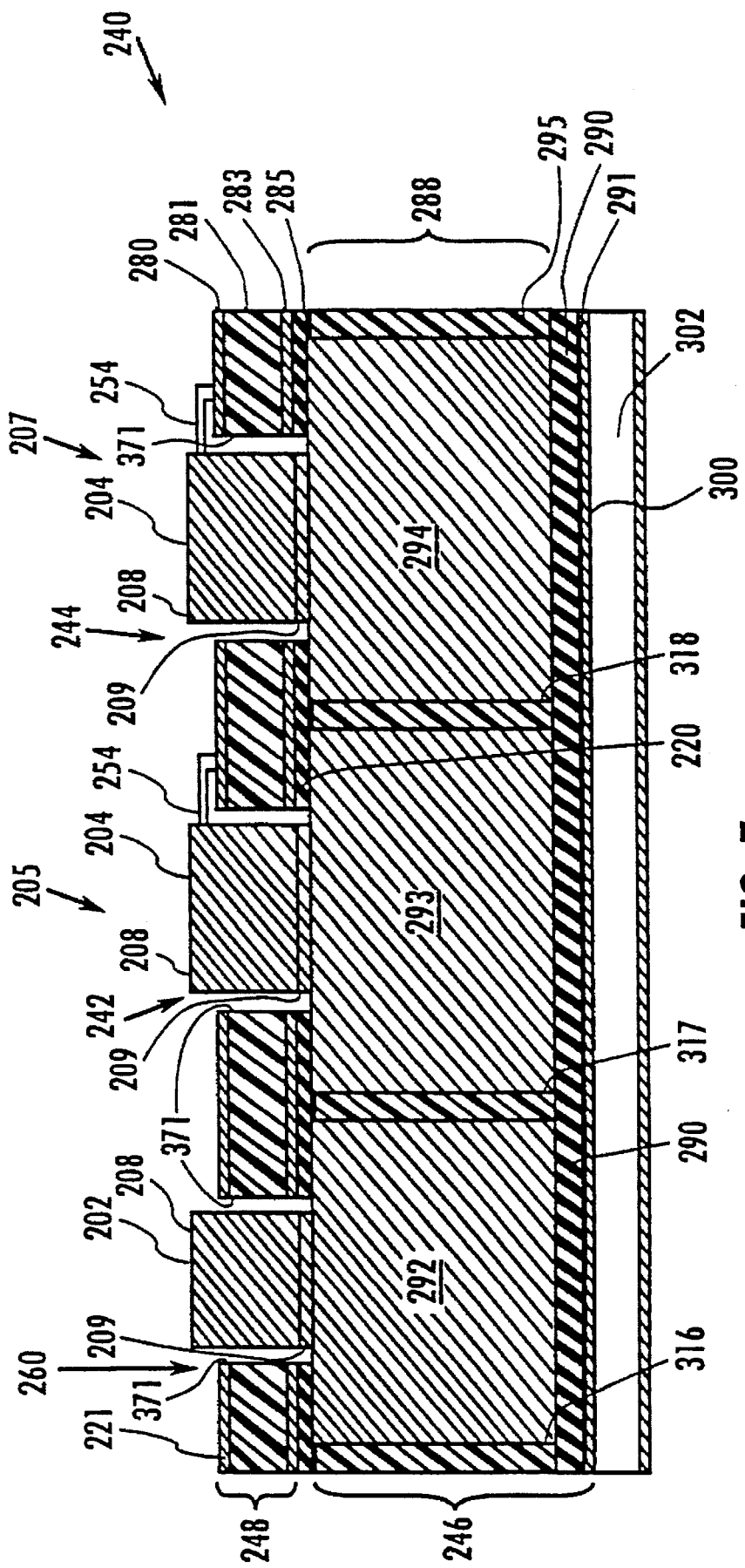
FIG. 7 is a cross-sectional view of the power module illustrated in FIG. 6 along line 7—7.
Figure 8:
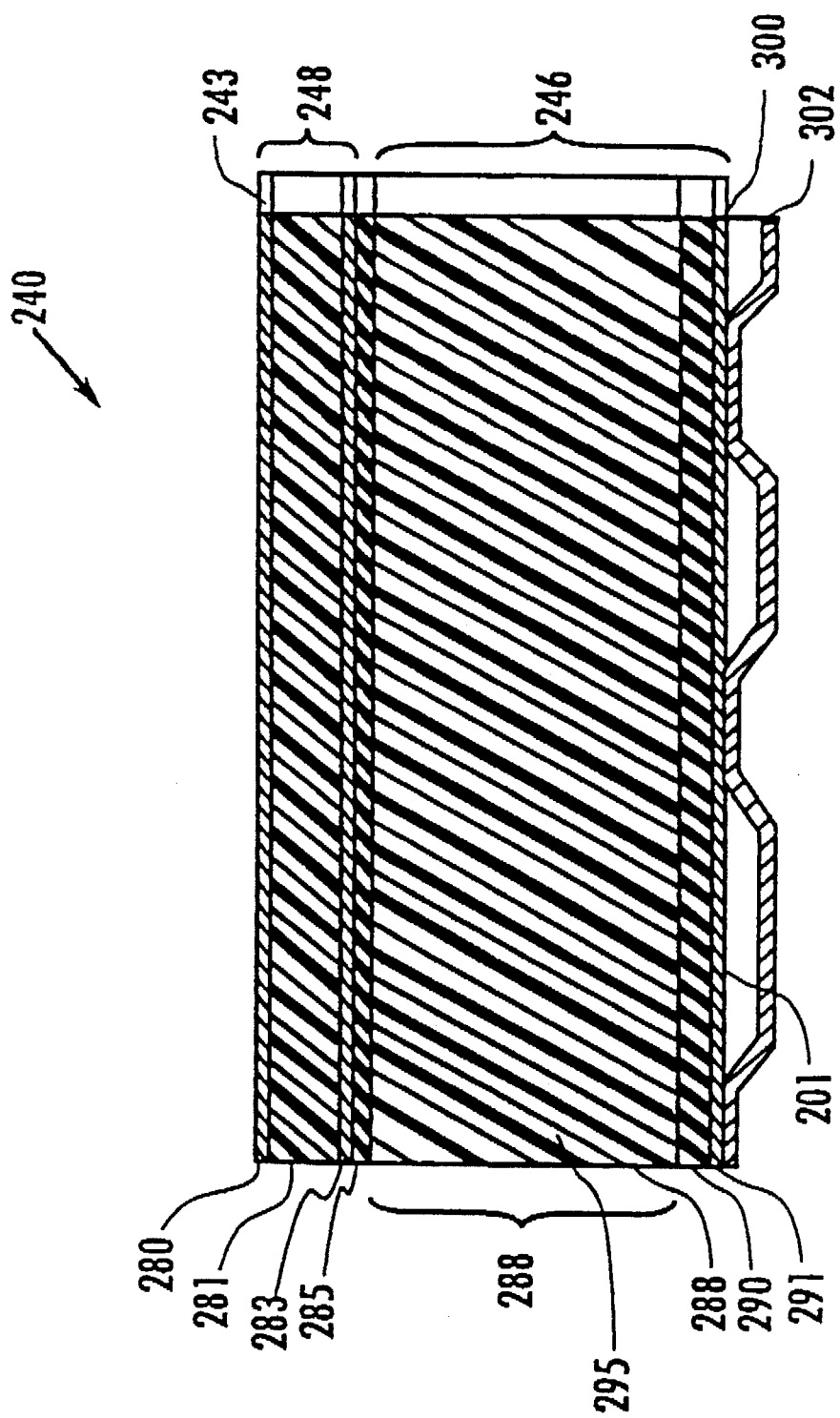
FIG. 8 is a cross-sectional view of the power module illustrated in FIG. 6 along line 8—8.

With reference to FIGS. 7 and 8, board 201 (FIG. 1) or module 240 (FIGS. 7 and 8) is comprised of circuit board layer 248 and mounting layer 246. Layer 248 is preferably a double sided printed circuit board layer including a conductive layer 280, an insulative layer 281, and a conductive layer 283. Layer 280 is a 1 oz. copper layer (0.0014 inch thick metal layer) which is plated to at least a 0.0024 inch final thickness. Layer 283 is a 2 oz. copper layer (0.0028 inches thick). Layer 281 is preferably 0.009 to 0.006 inch thick layer of glass epoxy material. An insulative layer 285 is preferably an at least 0.005 inch thick layer of prepreg bond film material adhered between layers 246 and 248.

Layer 246 is an enhanced metal circuit board layer including an enhanced thermally and electrically conductive layer 288, an insulative layer 290, and a conductive layer 291. Layer 246 is a double sided printed circuit board layer.

Enhanced conductive layer 288 is comprised of conductive members or slugs 292, 293 and 294 mounted in an insulative frame 295. Enhanced metal circuit board layer 246 also includes a conductive member or slug 297 (FIG. 6), similar to slug 292 (FIGS. 6 and 7), for the second rectifier 202. (FIG. 6). Insulative layer 290 is placed on enhanced conductive layer 288 as a resin, uncured adhesive, or an epoxy laminate and cured to form a rigid layer. Layer 290 is preferably at least one 0.002 inch layers (e.g., two) of a prepreg bond film material.

Insulative frame 295 is a 0.0324 inch thick frame having rectangular apertures 316, 317, 318, and 319 (FIG. 11) configured to support slugs 293,294, 295 and 297, respectively. Insulative frame 295 is manufactured from a glass epoxy, multiple layers of prepreg bond film material, or other insulative material. Slugs 292, 293, 294 and 297 are preferably 0.0324 inch thick rectangular copper members which are significantly larger than lead frames 209 or the footprint associated with rectifiers 202 and switches 204. The large size of slugs 292, 293, 294, and 297 enhances the thermal capabilities of board 201. Conductive layer 291 is a 1 oz. copper layer (0.0014 inch thick metal layer) which is plated to a thickness of at least 0.0024 inches thick.

Conductive layers 280, 283 and 291 and slugs 292, 293 and 294 are preferably copper, but can be silver, conductive inks, aluminum, or other conductive materials which are etched or deposited to provide conductors such as a printed circuit board conductor (not shown in FIGS. 5–9). Insulative layers 281, 285 and 290 and insulative frame 295 are preferably glass reinforced epoxy, prepreg bond film, BT, GR4, FR4, paper mica, teflon fluorolpolymer, insulative resin, or other insulating materials. Insulative layer 285 is between layers 246 and 248 and prevents printed circuit conductors (not shown in FIGS. 7 and 8) from shorting with printed circuit conductors of other layers.

In the presently preferred embodiment, conductive layers 280, 283, 291 and slugs 292, 293 and 294 have the same coefficient of thermal expansion as insulating layers 281, 285 and 290, and frame 295. In particular, all conductive layers and slugs are made of copper and all insulating layers are reinforced resinous layers formulated to provide a coefficient of thermal expansion matching that of copper. Thus, as the various layers of module 240 are heated during operation, heat is dissipated by slugs 292, 293 and 294 to surrounding portions of board 201 and to a heat sink as described below. As module 240 expands and contracts in subsequent thermal cycles due to use and to environmental conditions, internal stresses are minimized by the uniform expansion of all layers of board 201. Additionally, module 240 is thermally expansion matched to the packages of rectifiers 202 and switches 204.

Slugs 292, 293, 294 and 297 and insulating frame 298 cooperate to provide footprints, pads, mounting areas or contact areas for receiving elements of packages, lead frames 209 of rectifiers 202 and switches 204 or bare silicon components. Slug 293 is electrically coupled to bus 220 and electrically coupled to lead frame 209 of switches 204 in bank 205. Slug 294 is electrically coupled to lead frame 209 of switches 204 in bank 207 and electrically coupled to motor output bus 212. Slug 292 is coupled to phase input bus 210 and receives lead frame 209 of rectifier 202 in recess 262. Anode lead 259 of rectifier 202 in recess 260 is also coupled to bus 210. Slug 297 (FIG. 6) is coupled to bus 214 and lead frame 209 of rectifier 202 in recess 262. The electrical coupling of the various components and busses is accomplished through the use of plated surfaces and holes as will be described more fully below.

Walls 371 of recesses 242, 244, 260 and 262 are preferably plated with a conductive material such as copper. The plating of walls 371 allows layers 280 and 283 to be coupled to slugs 292, 293, 294 and 297.

A heat sink area 300 is preferably provided on layer 291 of enhanced metal circuit board layer 246 to receive a heat sink 302. Heat sink area 300 allows a heat conductive component such as heat sink 302 to be soldered directly to mounting or enhanced metal circuit board layer 246. Heat sink 302 can be a copper, aluminum, or other conductive material designed for dissipating heat. Heat sink 302 is preferably a light weight, crimped or stamped, continuous copper coil material or industry standard heat sink such as those manufactured by Thermalloy, Inc. or E&G Wakefield Engineering. Lightweight copper coil materials such as those ordinarily utilized in automotive radiator systems provide an inexpensive heat dissipating medium for module 240 which can be directly soldered to board 201.

Module 240 is preferably a solderable component module (SCM™) interconnect, SIP module, or other board which can be perpendicularly mounted in a parent or motherboard (not shown). Preferably, the motherboard has an aperture or trench configured to receive edge 203 (FIG. 6) of board 201. Board 201 includes a phase voltage mounting leg 243, DC bus mounting legs 245 and a control signal mounting leg 314. Legs 243, 245, 314, and edge 203 are shaped and arranged to ease placement and soldering of board 201 in the motherboard.

With reference to FIGS. 9–12, the printed circuit layout for conductive layers 280, 283, and 291 and enhanced conductive layer 288 of board 201 are shown in detail and constructed as described below. Layers 280, 283, and 288 and 291 are optimized to minimize lead lengths associated with circuitry 200 so inductive effects on board 201 are minimized. Layers 280, 283 and 288 have busses running in parallel to maximize capacitance and minimize inductance associated with board 201.

Figure 9:
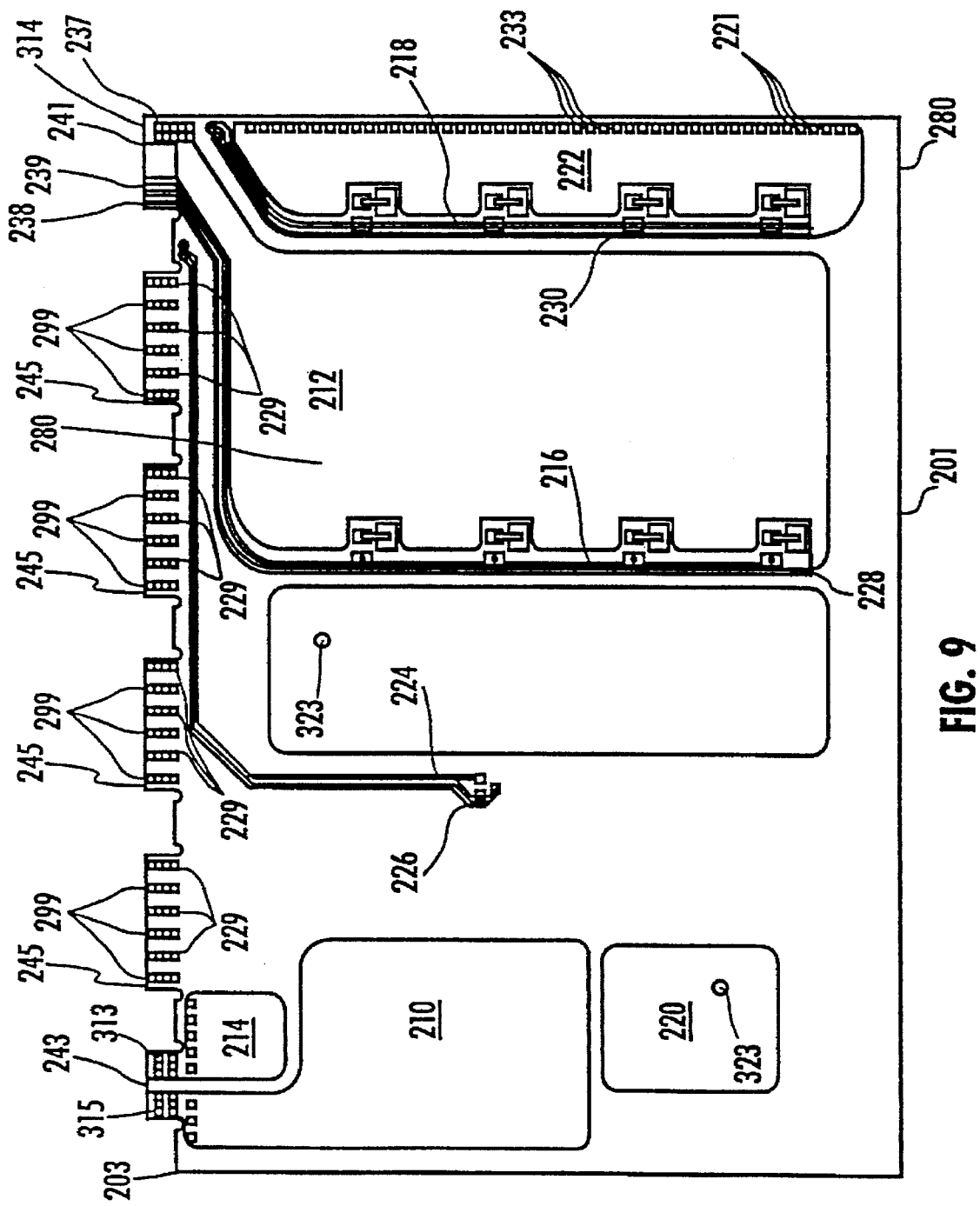
FIG. 9 is a top view of a first conductive layer in the power module circuit board illustrated in FIG. 6.

Phase voltage mounting leg 243 includes a finger connector 315 and a finger connector 313 (FIG. 9). Finger connector 315 is coupled to bus 210, and finger connector 313 is coupled to bus 214. DC mounting legs 245 preferably include power finger connectors 229 and power finger connectors 299. Finger connectors 229 and 299 are arranged adjacent each other; six finger connectors 299 and 229 are provided on each mounting leg 245. Finger connectors 229 and 299 are coupled to buses 220 and 222, respectively. This advantageous orientation of finger connectors 229 and 299 reduces parasitic inductance associated with making connections between module 240 and the motherboard, circuit boards or other mounting interface.

Figure 12:
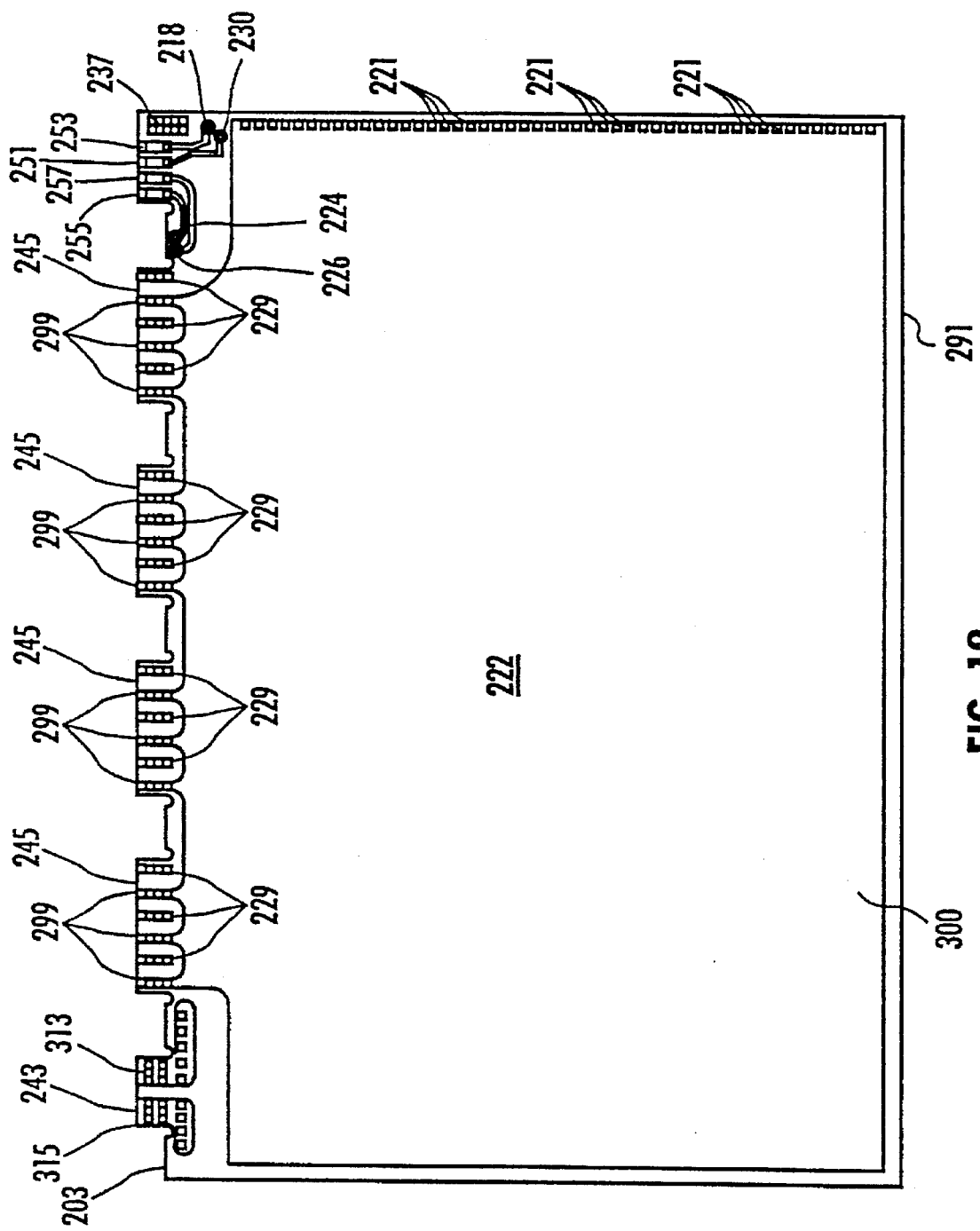
FIG. 12 is a top view of a third conductive layer for the power module circuit board illustrated in FIG. 6.

Control signal mounting leg 314 includes finger connectors 238, 239 and 241 on layer 280 and finger connectors 251, 253, 255 and 257 on layer 291 (FIG. 12). Finger connectors 239 and 241 are coupled to buses 216 and 228, respectively. Finger connectors 251 and 253 are coupled to buses 230 and 218, respectively. Finger connectors 255 and 257 are coupled to buses 224 and 226, respectively.

Finger connectors 229, 299, 255, 257, 251, 253, 238, 239, 241, 313 and 315 on mounting legs 243, 245 and 314 advantageously reduce noise, parasitic inductance, and impedance associated with the connections between module 240 and other circuit boards in motor controller. Reducing parasitic inductive effects allows module 240 to be electrically viewed as though it is mounted on the same circuit board as other components on the motherboard, thereby simplifying the design of the motor controller system.

Additionally, reducing parasitic inductive effects allows snubber circuits, filters and other networks typically required in high power applications to be eliminated.

In FIG. 9, motor output bus 212 is shown etched on layer 280 so source leads 254 of switches 204 in bank 205 can be coupled to motor output bus 212. Similarly, negative DC power bus 222 on layer 280 is etched so source leads 254 of switches 204 in bank 207 can be coupled to bus 222.

Phase input bus 210 is etched on layer 280 for coupling to rectifiers 202 in recesses 260 and 262 (FIGS. 6 and 7). Bus 214 is also etched in layer 280 so anode lead 259 of rectifier 202 in recess 260 can be coupled to bus 214. Buses 210 and 214 are coupled to finger connectors 313 and 315, respectively, on mounting leg 314 of board 201. As shown in FIG. 5, recess 260 (FIG. 6) is coupled to bus 210, and recess 262 is isolated from any connectors on layer 280. Similarly, recess 242 (FIG. 6) is isolated from any connectors on layer 280. Recess 244 is coupled to bus 212. Bus 222 is coupled through holes 221 on layer 280 to reduce noise associated with circuitry 200.

Figure 10:
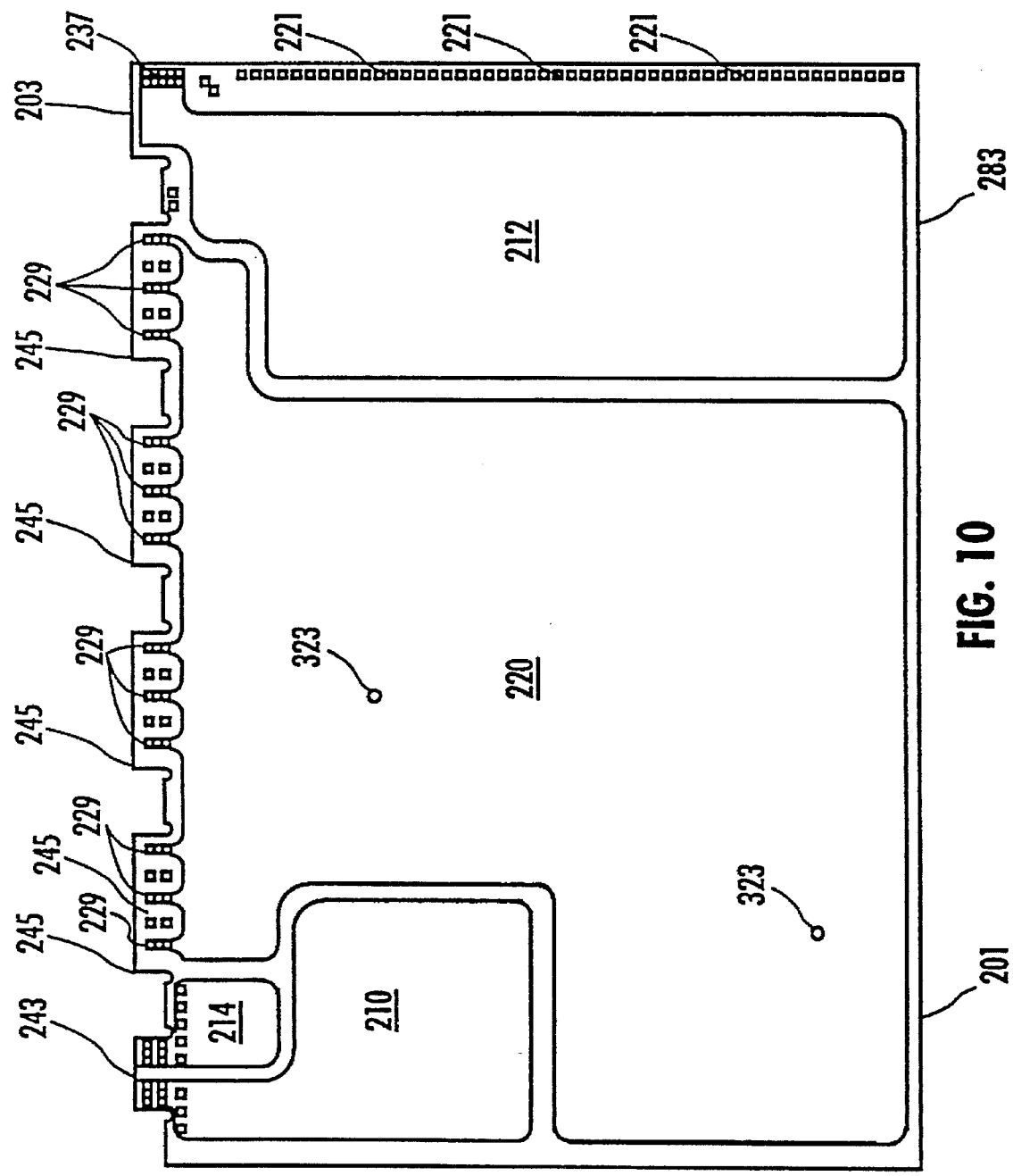
FIG. 10 is a top view of a second conductive layer on the power module circuit board illustrated in FIG. 6.
Figure 11:
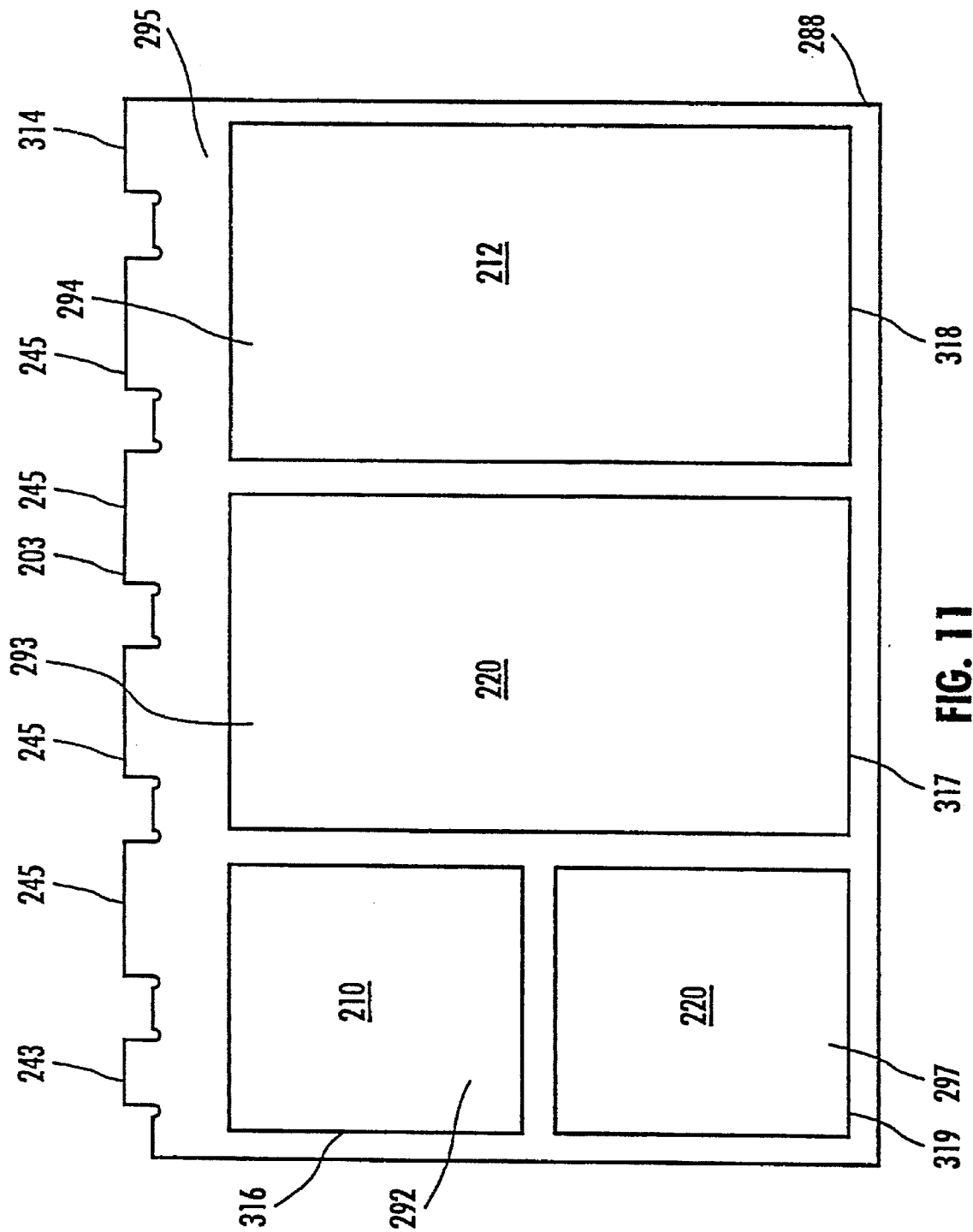
FIG. 11 is a top view of an enhanced metal circuit board layer including an insulative frame and copper slugs for the power module circuit board illustrated in FIG. 6.

As shown in FIG. 10, conductive layer 285 is shown etched to provide buses 210, 212, 214 and 220. Bus 220 is coupled to finger connectors 229. Bus 212 is coupled to plated holes 237 which provide connections to bus 212 on other layers, such as figure connector 314 on layer 280 (FIG. 9). Buses 214, 210, 212 and 220 on layer 283 are preferably configured to match the geometry of enhanced conductive layer 288 (FIG. 11). In this way, enhanced conductive layer 288 does not have to be etched or otherwise manipulated to form conductive lines.

Layer 283 is configured so that bus 212 corresponds to recess 244, bus 220 corresponds to recesses 242 and 262, and bus 210 corresponds to recess 260. Plated holes 323 allow connections of bus 220 to other conductive layers such as layers 280, 288 and 291.

With reference to FIG. 11, insulative frame 295 is designed so slugs 292, 293, 294 and 297 are placed in alignment with buses 210, 220, 212 and 220, respectively. Slugs 292, 293, 294 and 297 preferably fit flush within apertures 316, 317, 318 and 319, respectively, so voids are eliminated between frame 295 and slugs 292, 293, 294, and 297. Apertures 316, 317, 318 and 319 are spaced 0.159 inches apart to provide adequate isolation between slugs 292, 293, 294 and 295 and are milled in a fiber reinforced insulative layer such as FR-4 fiber reinforced epoxy circuit board or prepreg material to form frame 295. Alternatively, frame 295 may be formed by molding, cutting, drilling, or other configuration process. Slugs 292, 293, 294 and 297 may be advantageously formed of other shapes or sizes. Preferably, slugs 292, 293, 294 and 297 have an enhanced thickness and area to assist in the dissipation of heat from switches 204 and rectifiers 202.

As shown in FIG. 12, negative DC power bus 222 including heat sink area 300 is provided on conductive layer 291. Bus 222 is coupled to finger connectors 299 on board 201 of module 240.

Finger connectors 229, 299, 313, 315, 237, 255, 251, 253 and 257 provide an advantageous coupling of the various buses between layers 280, 283, 288 and 291. Additionally, negative DC power bus 222 is coupled between conductive layers 280, 283, 288 and 291 via plated holes 221. Bus 222 is configured to cover almost all of layer 291 and provide heat sink area 300.

Finger connectors 229, 239, 241, 251, 253, 255, 257, 294, 313 and 315 are configured to be coupled to plated-through finger connectors or hemicylinders in the mounting hole, aperture, trench or slot in the motherboard. Alternatively, mounting legs 243, 245, and 314 may be adapted for use in a slot edge connector, card connector, or other printed circuit board connector.

It should be noted that the foregoing construction of module 240 creates relatively large, parallel planes of conductive material defining busses 220 and 222 (see FIGS. 10 and 12). Unlike known power substrates, wherein DC busses are typically defined as surface traces on a substrate material and coupled to the power components by wire bonding techniques, the arrangement of busses 220 and 222 provides a large area for canceling or reducing parasitic inductance during switching phases of the inverter circuitry. The inventors have found that voltage spikes during turnoff phases of operation of switches 204 may thus be virtually eliminated without recourse to snubbing circuitry or the like.

It should also be noted that the preferred structure described above provides considerably enhanced thermal properties heretofore unavailable in power substrate modules. Thus, as mentioned above, the use of thermally matched layers, including slugs 292, 293, 294 and 297, affords consistent and uniform expansion of the various portions of substrate module 240 throughout successive thermal cycles. Moreover, the use of relatively massive slugs which are thermally matched to the board material as bases for component packages 208 not only provides for electrical connection with the circuit components, but affords a large heat dissipative layer in direct contact with the components. Where such layers are shared by several components, as in the preferred design described above, the slugs provide more uniform steady state temperatures and temperature gradients across and through board 201 than were available in heretofore known power substrates. Slugs 293 and 294 aid in paralleling switches 204 due to the low thermal resistance between adjacent switches 204 in banks 205 and 207. In addition, because the slugs are thermally coupled to bus 291, and thereby to heat sink 302 through a single insulating layer 290, heat generated by operation of the power circuitry is transferred more directly to the heat sink than in known designs.

The manufacture of board 201 of module 240 is discussed below with reference to FIGS. 6–12. Enhanced conductive circuit board layer 246 is formed by placing slugs 292, 293, 294 and 297 in windows or apertures 316, 318, 319 and 317 of frame 295, respectively. Slugs 292, 293, 294 and 297 can be adhered in frame 295 with epoxy, or other adhesives. An uncured prepreg bond film layer such as layer 290 is then spread on one side of enhanced conductive layer 288 to form insulative layer 290. Layer 290 is preferably two 0.002 inch thick epoxy laminate layers. Conductive layer 291 is attached to layer 290 and then can be etched to form the conductive pattern shown in FIG. 12. Enhanced conductive layer 288 advantageously does not have to be etched due to the insulative nature of frame 295.

Layer 248 can be a conventional circuit board layer which is well known in the art. Layers 280 and 283 are attached to an insulative layer 281. Layer 283 is etched to form particular conductive patterns as shown in FIG. 6. After etching layer 283, layer 248 is then attached to layer 246 by placing an adhesive insulative layer 285 between layers 248 and 246. Layers 246 and 248 are then heat and pressure cured so layers 246 and 248 are attached and layer 290 is cured. Layer 280 can also be etched to from the pattern shown in FIG. 9, including footprints and contact areas for receiving switches 204 and temperature sensor 206.

After attachment of layers 246 and 248, multilayer circuit board 201 is adapted to form windows or recesses 260, 262, 242 and 244. Recesses 242, 244, 260 and 262 are preferably milled by a depth controlled mill. A depth control mill may be utilized to form windows without requiring a high tolerance machine because the thickness of slugs 292, 293, 294 and 297 in enhanced conductive layer 288 is sufficient (approximately 0.030 inches) to permit a tool, such as a mill cutter, to be lowered through layer 248 to form windows 260, 262, 242 and 244 without piercing the slugs. After configuring, cutting, milling, or otherwise forming recesses 242, 244, 260 and 262 in multilayer circuit board 201, holes, such as holes associated with finger connectors 313, 315, 229, 299, 241, 239, 237, 233, 327, and 323 and holes 221 and 323 are drilled in board 201. After drilling, a solder mask or photo resist layer is applied to layers 280 and 291, and board 201 is further plated and etched. In particular, layer 291 is etched to form the pattern shown in FIG. 12. Further plating of circuit board 201 allows walls 371 (FIG. 7) of recesses 260, 262, 242 and 244 to be plated with conductive material. Plating walls 371 allows connection of the mounting area or slugs 292, 293, and 297 to layers 280 and 283.

Alternatively, recesses 242, 244, 260, and 262 may be formed in layer 248 before attaching layers 246 and 248. Further, recesses 242, 244, 260, and 262 may be formed by drilling, cutting, molding, or otherwise configuring circuit board layer 248. For example, recesses 260, 262, 242 and 244 can be formed by providing mounting areas close to one end of board 201. Circuit board layer 248 may be a size smaller than layer 246 and shifted to one end so only enhanced conductive layer 246 is provided on the opposite end of board 201. Also, layer 248 may be comprised of unitary pieces which are configured on top of layer 246 to form recesses 242, 244, 260 and 262.

Figure 13:
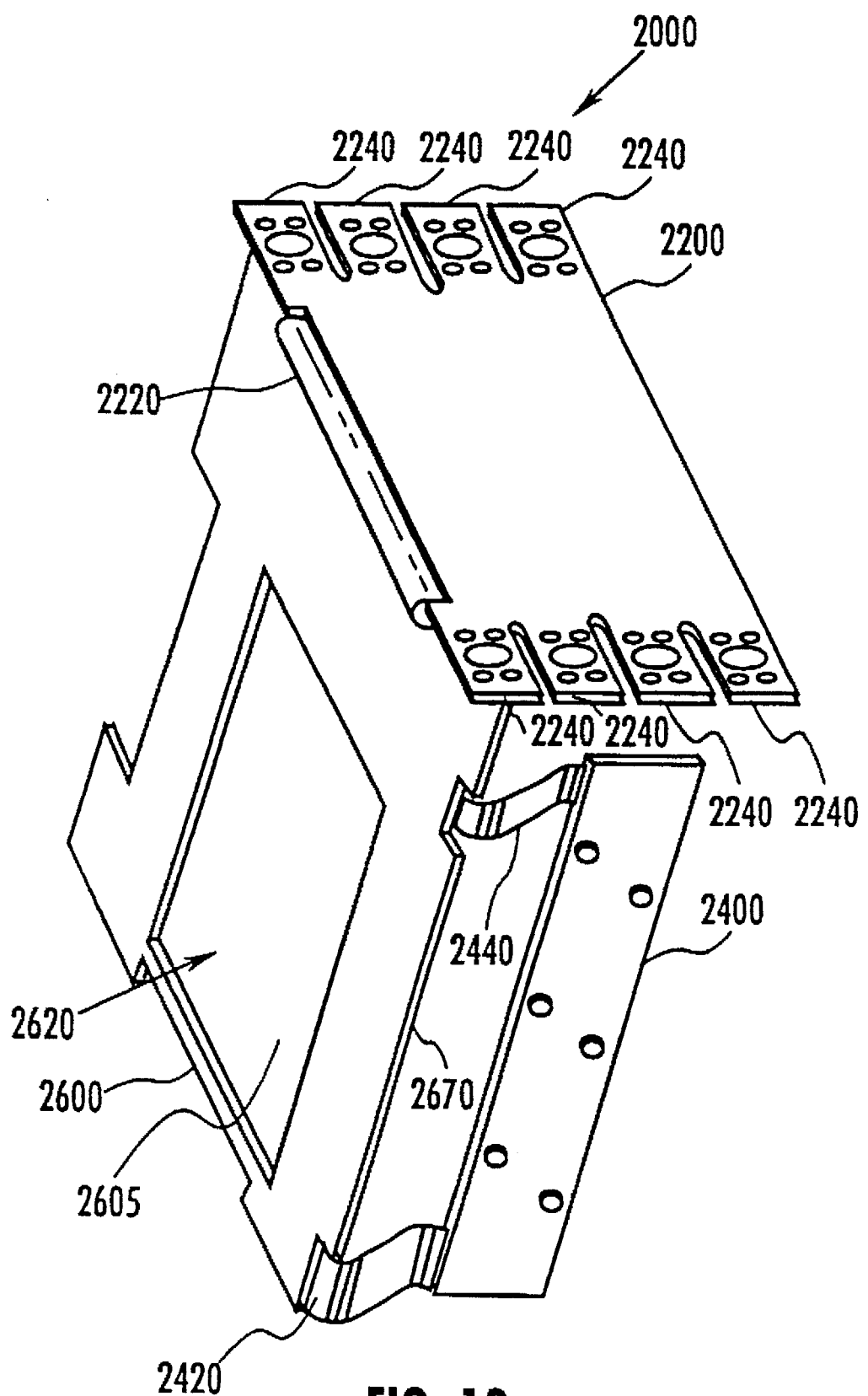
FIG. 13 is a perspective view of a multilayer rigid-flex circuit board system in a perpendicular configuration for a motor controller according to a second exemplary embodiment of the present invention.

With reference to FIG. 13, an advantageous rigid-flex multilayer circuit board system 2000 is shown implemented as a motor controller package. Motor controller circuit board system 2000 includes a module, motherboard, or customer interface board 2200 having connector tabs 2240, a module or power substrate 2600, and a module or a capacitor board 2400. Power substrate 2600 preferably houses IGBT's, SCR's, thyristors or other semiconductor switches (not shown) which provide alternating current (AC) power signals for use by a motor (not shown). Preferably, power substrate 2600 includes a window 2620 which has only a flexible circuit board layer 2605 at a locus between a top surface 2650 and a bottom surface 2670 (FIG. 15). Preferably, a heat sink (not shown) is mounted on a heat sink area 2660 (FIG. 15) of surface 2670 and surface mount semiconductor devices are attached to surface 2650 in window 2620.

In this embodiment, substrate 2600 is configured as a motherboard in the conventional mechanical sense. Alternatively, an additional circuit board (not shown) can be added to system 2000 and utilized as the motherboard. According to another alternative, customer interface board 2200 or capacitor board 2400 can be configured as the motherboard.

System 2000 is preferably manufactured from a single flexible circuit layer 2605, a rigid circuit board layer 2608, and a rigid circuit board layer 2210 (FIG. 15). Layer 2605 is preferably a single or double sided printed circuit board layer including a rigid 0.030 inch thick insulating layer (not shown) disposed between 0.0027 inch thick glass fiber bond ply (e.g., 1080 GF) layers (not shown). The insulating layer can be a fiber reinforced material such as GF4. A 0.0027 inch thick glass fiber bond film layer (not shown) is also provided between layers 2605 and 2508. A thin conductive or metal layer is provided on top of the top bond film layer.

Layer 2605 is preferably a flexible circuit board layer manufactured by Parlex Corporation of Methuen, Mass. Layer 2605 includes a 0.0007–0.001 inch thick polyimide layer, a 0.001–0.002 inch thick polyimide adhesive layer, a 2.0-ounce (0.0028 inch thick) copper layer, a 0.00125 inch thick polyimide Kapton® MT adhesive polyimide layer, a 2.0-ounce (0.0028 inch thick) copper layer, a 0.001–0.002 inch thick polyimide adhesive layer, and a 0.0007–0.001 inch thick polyimide layer. The layers comprising layer 2605 are attached to each other in the order listed above. Layer 2605 can be doped with diamond material, AlN, $Al_2O_3$ or other substances to increase thermal conductivity and provide enhanced corona resistance.

Layer 2610 is attached to layer 2605. Layer 2610 includes an insulating layer of 0.0018–0.0027 inch thick glass fiber bond film material (e.g., 1080 GF or 106) attached to thin conductive or metal layer. The conductive layer is a 0.001 inch thick layer of HTE copper which is plated with a 0.001 inch copper layer.

Layer 2605 is preferably continuous with customer interface board 2200, substrate 2600, and capacitor circuit board 2400. Flexible layer 2605 provides power bus connectors 2420 and 2440 between substrate 2600 and capacitor board 2400. Connectors 2420 and 2440 preferably house a positive and negative power bus conducting line on each side of connectors 2420 and 2440 (e.g., layer 2605). Additionally, layer 2605 provides a connection 2220 from substrate 2600 to motherboard 2200.

Customer interface board 2200 and capacitor circuit board 2400 are preferably disposed at a 90° angle with respect to substrate 2600 as shown in FIG. 13. A heat sink (not shown) is preferably attached to surface 2670 (e.g., on the same side of substrate 2600 from which board 2200 and capacitor board 2400 extend). This advantageous orientation of system 2000 provides wireless motor controller package which has superior heat dissipation in a compact package. Alternatively, the sides of substrate 2600 upon which electrical devices and heat sinks are mounted can be switched.

The configuration of circuit board system 2000 allows high power connections to be made between board 2200, board 2400 and substrate 2600 without the use of bulky, unreliable and expensive connectors for interconnecting motherboard 2200, board 2400, and substrate 2600. Further, the flexibility associated with flexible layer 2605 allows board 2200, board 2400 and substrate 2600 to be manipulated for various mechanical packages and eases manufacture of circuit board system 2000. The use of connections between board 2200, board 2400 and substrate 2600 via flexible layer 2605 reduces the use of external wires and connectors and hence, the parasitic inductance associated with the interconnection of circuit boards. Therefore, circuit board system 2000 provides an advantageous compact structure for a motor controller which is not prone to parasitic inductance problems. Additionally, use of layer 2605 for connections dramatically reduces creepage and clearance distance concerns due to the high voltages present. Furthermore, the use of layer 2605 for connections provides impedance control and ground planes in logic interconnect areas of system 2000.

With reference to FIG. 15, an enlarged cross sectional view of a portion of system 2000 shows layers 2605, 2608 and 2610. Preferably, the thin flexible layer 2605 allows superior heat transfer from surface 2650 to surface 2670 of substrate 2600. Board 2600 preferably includes heat sink area 2660 on bottom surface 2670 of layer 2605. Alternatively, window 2620 or area 2660 can be configured to have rigid strips (not shown) of layer 2608 or layer 2610 provided in a matrix across window 2620 or area 2660. The rigid strips provides superior mechanical strength for system 2000 at window 2620 or area 2660.

It is understood that, while the detailed drawings, specific examples and particular materials given describe preferred exemplary embodiments of the present invention, they are for the purpose of illustration only. The invention is not limited to the precise details and conditions disclosed. For example, although particular surface mount packages, electrical devices, and circuit board layers are described, the multilayer circuit board may be populated with other types of heat producing components or comprised of different materials. Also, various configurations for a heat sink conducting area may be utilized. Further still, various shapes, sizes, and materials for the copper slugs may be utilized. Moreover, while the particular circuits are shown as motherboards in the mechanical sense, other types of circuits may be housed on the motherboard. Further still, while the power substrate module described above provides rectifying and inverting circuitry for a single phase, modules employing the same construction may be built for three phase rectification and inversion on a single board. Similarly, although the structure described above employs four switching circuits in parallel to accomplish the desired inverting function, modules in accordance with the invention may be built with more or fewer switching devices in parallel, or a single pair of switches per phase. Various changes can be made to the details disclosed without departing from the spirit of the invention which is defined by the following claims.

What is claimed is:

1. A wireless motor controller, comprising:
   a power substrate circuit board including semiconductor switches;
   a capacitor circuit board including a plurality storage capacitors coupled between a positive bus and a negative bus situated on the capacitor circuit board; and
   a first circuit board mechanically and electrically coupled to at least one of the power substrate circuit board and the capacitor circuit board, the positive bus and the negative bus on the capacitor circuit board being electrically coupled to the power substrate circuit board via a connection of solely printed wire circuit board conductors, whereby parasitic inductive effects are reduced as compared with a conductor arrangement in a conventional motor controller system.

2. The wireless motor controller of claim 1 wherein the printed wire circuit board conductors are provided on a flexible circuit board layer extending between the power substrate circuit board and the capacitor circuit board, the flexible circuit board layer providing the connection.

3. The wireless motor controller of claim 1 wherein the first circuit board is a mother board including a first mounting aperture receiving a first edge of the power substrate circuit board and a second mounting aperture receiving a second edge of the capacitor circuit board, the first mounting aperture and the second mounting aperture each having a lateral face with a plated connector, the plated connector being part of the connection.

4. The wireless motor controller of claim 3 wherein the first mounting feature receives a first mounting leg of the power substrate circuit board at a first leg aperture and the second mounting feature receives a second mounting leg at a second leg aperture.

5. The wireless motor controller of claim 1 wherein the positive bus is provided on a first side of the capacitor circuit board and the negative bus is provided on a second side of the capacitor circuit board and the positive bus is coupled to a first set of finger connectors on the power substrate circuit board and the negative bus is coupled to a second set of finger connectors on the power substrate circuit board.

6. The wireless circuit board of claim 5 wherein the first and second sets of finger connectors are located situated interstitially on a first side of the power substrate circuit board and a second side of the power substrate circuit board.

7. The wireless circuit board of claim 6 wherein the second side of the power substrate circuit board includes a ground plane coupled to the negative bus and configured to receive a heat sink.

8. The wireless motor controller of claim 3 wherein the first and second mounting apertures are oval shaped holes having plated through finger connectors on a lateral face of the slot.

9. The wireless motor controller of claim 3 wherein the power substrate circuit board and the capacitor board are mounted in a perpendicular fashion with respect to the mother circuit board.

10. A motor controller circuit board system, the circuit board system comprising:
    a power substrate mounting board including semiconductor switches;
    a capacitor mounting board including a plurality storage capacitors coupled between a first bus and a second bus, the first bus and the second bus being situated on the capacitor mounting board; and
    a mounted circuit board including a plurality of mounting areas integral with the mounted circuit board, the mounting areas mechanically and electrically receiving the power substrate mounting board and the capacitor mounting board, the first bus and the second bus on the capacitor mounting board being electrically coupled to the power substrate mounting board via a connection of solely a plurality of printed wire circuit board conductors on the mounted circuit board, the connection being made without external wires and without external connectors, whereby parasitic inductance is reduced as compared with a conductor arrangement in a conventional motor controller system.

11. The motor controller circuit board system of claim 10 wherein the printed wire circuit board conductors include finger connectors at the mounting areas, and the mounting areas including apertures having lateral faces with plated connectors on the lateral faces.

12. The motor controller circuit board system of claim 10 wherein the power substrate mounting board includes a window exposing an enhanced metal circuit board layer.

13. The motor controller circuit board system of claim 12 wherein the enhanced metal circuit board layer is coupled to the first bus.

14. The motor controller circuit board system of claim 13 wherein the first bus is coupled to the enhanced metal circuit board layer via a plated portion of a wall of the window.

15. The motor controller circuit board system of claim 14 wherein the first bus is provided on a first side of the capacitor mounting board and the second bus is provided on a second side of the capacitor mounting board and the first bus is coupled to a first set of finger connectors on the power substrate mounting board and the second bus is coupled to a second set of finger connectors on the power substrate mounting board.

16. The motor controller circuit board system of claim 15 wherein the first and second sets of finger connectors located situated interstitially on a first side of the power substrate mounting board and a second side of the power substrate mounting board.

17. The motor controller circuit board system of claim 16 wherein the second side of the power substrate mounting board includes a ground plane coupled to the second bus configured to receive a heat sink, wherein the ground plane is coupled to the second bus.

* * * * *